United States Patent
Muha et al.

(10) Patent No.: US 8,970,190 B2
(45) Date of Patent: Mar. 3, 2015

(54) USING LOW VOLTAGE REGULATOR TO SUPPLY POWER TO A SOURCE-BIASED POWER DOMAIN

(75) Inventors: James Muha, Phoenix, AZ (US); Tim Wilson, Chandler, AZ (US); D C Sessions, Phoenix, AZ (US); Yong Yuenyongsgool, Gilbert, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 13/409,440

(22) Filed: Mar. 1, 2012

(65) Prior Publication Data

US 2012/0229112 A1 Sep. 13, 2012

Related U.S. Application Data

(60) Provisional application No. 61/451,202, filed on Mar. 10, 2011.

(51) Int. Cl.
*G05F 1/00* (2006.01)
*G11C 5/14* (2006.01)
*H01L 27/092* (2006.01)

(52) U.S. Cl.
CPC ............... *G11C 5/147* (2013.01); *H01L 27/092* (2013.01)
USPC ............................ 323/281; 323/271; 323/279

(58) Field of Classification Search
USPC .......... 323/282–285, 269, 271–273, 279, 281
See application file for complete search history.

(56) References Cited

U.S. PATENT DOCUMENTS

| 5,726,946 A | 3/1998 | Yamagata et al. ............ 365/226 |
| 6,040,736 A * | 3/2000 | Milanesi et al. .............. 327/541 |
| 2001/0048319 A1 | 12/2001 | Miyazaki et al. ................. 326/1 |
| 2004/0021501 A1 * | 2/2004 | Das et al. ....................... 327/534 |
| 2007/0132435 A1 * | 6/2007 | Hasegawa et al. ............ 323/222 |
| 2010/0148818 A1 * | 6/2010 | Deutscher et al. ............. 326/34 |
| 2010/0230780 A1 * | 9/2010 | Obayashi ...................... 257/529 |

FOREIGN PATENT DOCUMENTS

| JP | 10229165 A | 8/1998 | ............. H01L 27/04 |
| WO | 02/29893 A1 | 4/2002 | ............ H01L 27/092 |

OTHER PUBLICATIONS

International Search Report and Written Opinion, Application No. PCT/US2012/027985, 11 pages, Apr. 9, 2013.

* cited by examiner

*Primary Examiner* — Adolf Berhane
*Assistant Examiner* — Henry Lee, III
(74) *Attorney, Agent, or Firm* — King & Spalding L.L.P.

(57) ABSTRACT

A common (ground) of a low voltage regulator is connected to a virtual common (ground) of an integrated circuit device that is also connected to transistor sources but isolated from a true ground connected to the substrate of the integrated circuit device. The regulated output voltage from the low voltage regulator rises the same as the virtual ground voltage rises when back-biased sufficient to reduce leakage current to an acceptable level in a given process technology. Therefore, the output of the low voltage regulator will maintain a normal operating voltage for the logic during a power saving back-biased condition.

20 Claims, 6 Drawing Sheets

USING LOW VOLTAGE REGULATOR TO SUPPLY POWER TO A SOURCE-BIASED POWER DOMAIN

RELATED PATENT APPLICATION

This application claims priority to commonly owned U.S. Provisional Patent Application Ser. No. 61/451,202; filed Mar. 10, 2011; entitled "Using Ultra-Low Power Voltage Regulator to Supply Power to a Source-Biased Power Domain," by James Muha, Tim Wilson, D C Sessions and Yong Yuenyongsgool; which is hereby incorporated by reference herein for all purposes.

TECHNICAL FIELD

The present disclosure relates to voltage regulators, and, more particularly, to using a low voltage regulator to significantly reduce standby, sleep mode current draw in source-biased power domains of an integrated circuit device.

BACKGROUND

An integrated circuit device may electrically alter the threshold voltage of its NMOS transistors by raising the Vss power rail voltage above the bulk (e.g., well, tub, or substrate) voltage of the integrated circuit substrate (sometimes referred to as a "virtual ground"). This technique is commonly used to reduce the power consumption of the integrated circuit device due to sub-threshold leakage. Generally, the integrated circuit device will have two or more independent voltage domains to service respective core logic circuits that have signal paths therebetween; some of these voltage domains may operate on the virtual ground, and other voltage domains may operate on true ground.

Separate voltage supplies may be used to connect to N-MOS and P-MOS bulk regions in multiple well CMOS technologies. Modification of these voltages with respect to the primary power and ground supplies is called well-biasing. These supplies can be modulated to provide a back-bias voltage which causes an increase in the MOS device threshold voltage, Vth, thereby reducing the sub-threshold leakage. Back-bias tap cells have a basic function to provide access to the wells and/or substrate independent of the source connected transistors therein. Back bias tap cells provide power for wells of always-on cells while power is gated for retention of flip-flops states, power gates with buffers and always-on buffers. They also provide well access such that back biasing can be used for leakage optimization.

One way to dramatically lower the current of an integrated circuit device in a sleep state is to raise the ground rail voltage used by standard cells above the substrate voltage, commonly referred to as back-biasing. This reduces leakage current. Another way to reduce current while in a sleep state is to utilize a low voltage regulator since a loosely regulated, lower voltage is sufficient to maintain the logic cell states. This reduces bias current of not only the voltage regulator but of supporting macro cells like a band gap voltage reference. The aforementioned two techniques cannot be combined since the low voltage regulator does not provide a high enough voltage to maintain adequate noise margin when standard cells are in a back-biased state. A normal voltage regulator must be used to maintain adequate noise margin.

One problem with implementing source back-biasing is that the effective voltage across the biased circuits decreases due to the ground (common source) voltage rising which in turn reduces the reliability of the biased circuits. For example, in a source-biased power domain in 180 nanometer technology, the ground rail, called virtual ground, is raised to approximately 0.6 volts, so it is necessary to supply 1.8 volts to the power rail to allow for 1.2 volts of noise margin. Presently, that requires that the main voltage regulator be in operation since the output voltage of a low voltage regulator in 180 nanometer technology, for example, is only 1.2 volts, leaving just 0.6 volts of noise margin which is insufficient.

SUMMARY

Therefore it would be desirable for source back-biased circuits to retain the same effective voltage for noise margin when being powered by a low voltage regulator as when these circuits are not being back-biased.

According to an embodiment, a low voltage regulator coupled to source back-biased capable power domains may comprise: a low voltage regulator having a common thereof coupled to a virtual ground of at least one power domain in an integrated circuit die that is capable of being back-biased, an input coupled to a supply voltage, and an output coupled to and supplying a regulated voltage to transistors in the at least one power domain; and a true ground is coupled to a substrate of the integrated circuit die, wherein when the virtual ground is back-biased relative to the true ground sufficient to reduce leakage current to an acceptable level in a given process technology, the output voltage of the low voltage regulator rises with the virtual ground voltage so as to maintain substantially the same voltage to the transistors in the at least one power domain during back-biasing thereof.

According to a further embodiment, the regulated voltage from the low voltage regulator is approximately the normal operating voltage for logic minus an offset voltage at the virtual ground sufficient to reduce the leakage current to the acceptable level in the given process technology. According to a further embodiment, the regulated voltage from the low voltage regulator is approximately 1.2 volts for 180 nanometer process technology. According to a further embodiment, the at least one power domain is back-biased with a ground offset voltage relative to the true ground sufficient to reduce leakage current to an acceptable level in the given process technology.

According to a further embodiment, the ground offset voltage is about 0.6 volts for 180 nanometer process technology. According to a further embodiment, the true ground is at substantially zero (0) volts. According to a further embodiment, bias current of the low voltage regulator is about 100 nanoamperes which is typical for 180 nanometer process technology. According to a further embodiment, the substrate is a p-substrate having holes as majority carriers. According to a further embodiment, the virtual ground is coupled to sources of n-mos transistors fabricated in the p-substrate. According to a further embodiment, the low voltage regulator is used to power the at least one power domain during back-biasing thereof.

According to another embodiment, a method for powering a source back-biased capable power domain with a low voltage regulator may comprise the steps of: providing a low voltage regulator having a common thereof coupled to a virtual ground of at least one power domain in an integrated circuit die that is capable of being back-biased, an input coupled to a supply voltage, and an output coupled to and supplying a regulated voltage to transistors in the at least one power domain; coupling a true ground to a substrate of the integrated circuit die; and back-biasing the virtual ground relative to the true ground sufficient to reduce leakage current to an acceptable level in a given process technology, wherein the output voltage of the low voltage regulator rises with the virtual ground voltage so as to maintain substantially the same voltage to the transistors in the at least one power domain during the step of back-biasing thereof.

According to a further embodiment of the method, the regulated voltage from the low voltage regulator is approximately the normal operating voltage for logic minus an offset voltage at the virtual ground sufficient to reduce the leakage current to the acceptable level in the given process technology. According to a further embodiment of the method, during the step of back-biasing the virtual ground voltage there is a ground offset voltage sufficient to reduce leakage current to an acceptable level in the given process technology. According to a further embodiment of the method, the true ground is at substantially zero (0) volts.

According to a further embodiment of the method, bias current of the low voltage regulator is about 100 nanoamperes which is typical for 180 nanometer process technology. According to a further embodiment of the method, the substrate is a p-substrate having holes as majority carriers. According to a further embodiment of the method, the virtual ground comprises the step of coupling sources of n-mos transistors fabricated in the p-substrate to the virtual ground. According to a further embodiment of the method, the step of powering the at least one power domain during back-biasing thereof is done with the low voltage regulator.

BRIEF DESCRIPTION OF THE DRAWINGS

A more complete understanding of the present disclosure may be acquired by referring to the following description taken in conjunction with the accompanying drawings wherein.

Figure 1:
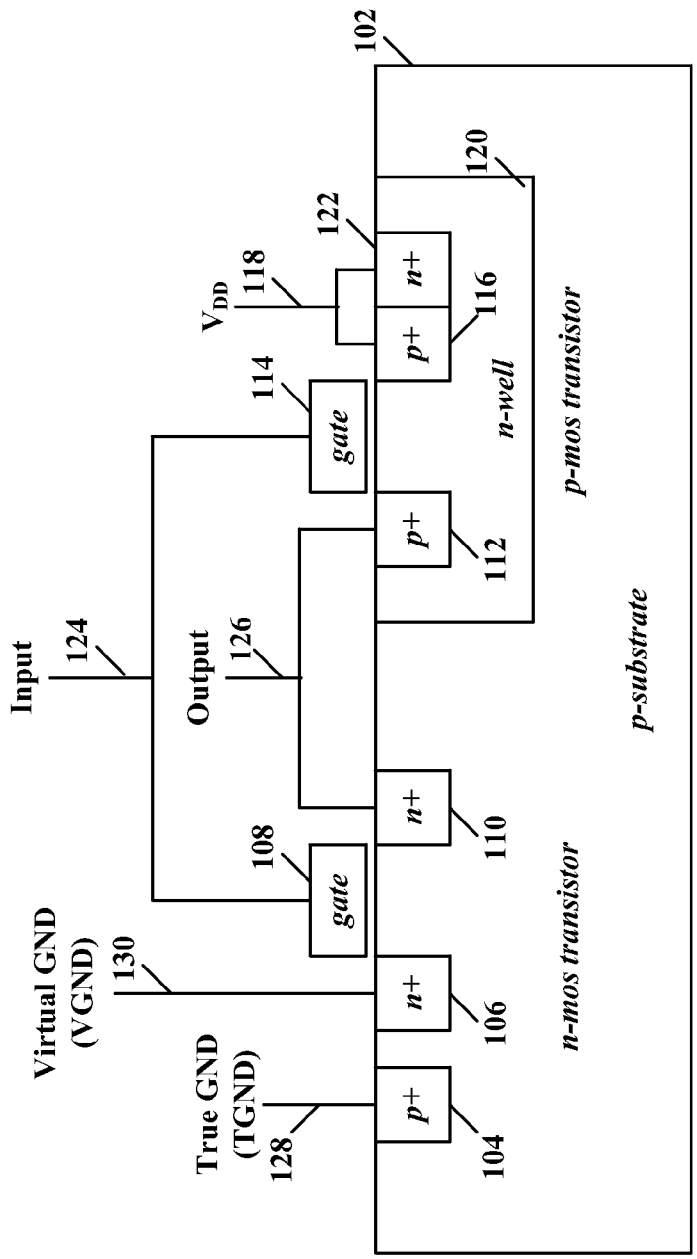
FIG. 1 illustrates a schematic elevational view of a portion of an integrated circuit device showing separate substrate and source common (ground) connections that are used to source back-bias transistors in the integrated circuit device, according to a specific example embodiment of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

If the common (ground) of a low voltage regulator is connected to a virtual ground of the integrated circuit die, the regulated output voltage from the low voltage regulator is raised by approximately the same amount that the back-biased virtual ground voltage is raised. Therefore, the output of the low voltage regulator will be approximately the normal operating voltage for logic minus the ground offset voltage. For example, in 180 nanometer process technology, this voltage level is approximately 1.8 volts which is about 1.2 volts above a 0.6 volt virtual ground.

Since the bias current of the main voltage regulator is in the one to two microampere range while the bias current of the low voltage regulator may be 100 nanoamperes for typical 180 nanometer process technology. Therefore significant power savings may be realized without sacrificing adequate noise margin for standard cells by replacing the main voltage regulator with a low voltage regulator, modifying the integrated circuit design such that transistors that previously were connected to true ground are now connected to virtual ground, and substrate taps are connected to true ground. Several microamperes of current may thereby be eliminated in a sleep or deep sleep state while maintaining adequate noise margin. Additionally, the bias current of a band gap voltage reference can be eliminated, thereby saving several more microamperes.

Referring now to the drawings, the details of a specific example embodiment is schematically illustrated. Like elements in the drawings will be represented by like numbers, and similar elements will be represented by like numbers with a different lower case letter suffix.

Referring to FIG. 1, depicted is a schematic elevational view of a portion of an integrated circuit device showing separate substrate and source common (ground) connections that are used to source back-bias transistors in the integrated circuit device, according to a specific example embodiment of this disclosure. An integrated circuit die may comprise a p-substrate 102 having n-mos and p-mos transistors formed therein. A typical n-mos transistor comprises an n+ source 106, a gate 108 and an n+ drain 110. A typical p-mos transistor comprises p+ drain 112, a gate 114 and a p+ source 116. The p-mos transistor is fabricated in an n-well 120 formed in the p-substrate 102. An n+ tap 122 is formed in the n-well 120 and is coupled to $V_{DD}$ and the p+ source 116 with a metal connection 118. A p+ tap 104 separate from the n+ source 106 of the n-mos transistor couples the p-substrate 102 to a true ground 128, TGND, connection, and the n+ source 106 is therefore independently connected to a virtual ground 130, VGND, connection. Insulating oxides are not shown for illustrative clarity.

Figure 2:
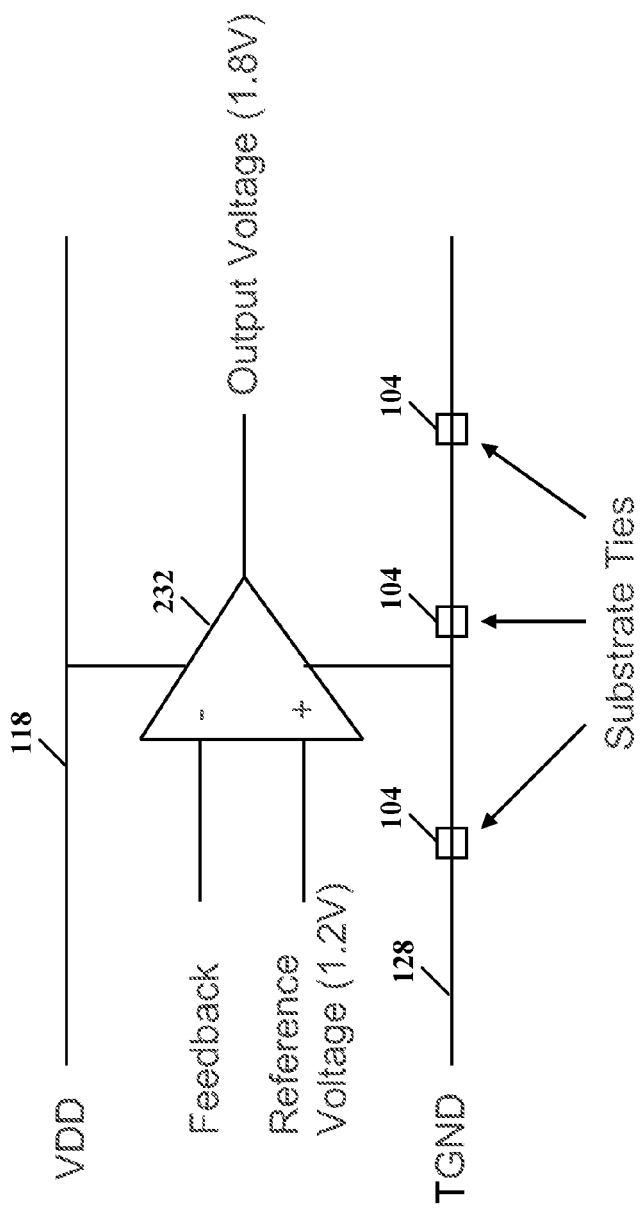
FIG. 2 illustrates a greatly simplified schematic diagram of a standard voltage regulator.

Referring to FIG. 2, depicted is a greatly simplified schematic diagram of a standard voltage regulator. A standard (main) voltage regulator 232 has a common rail connected to the same true ground, TGND, connection 128 that is also coupled to the p+ (substrate) ties 104. The regulated output voltage of the regulator 232 has to be the normal operating voltage for logic in a given process technology, for example, in 180 nanometer process technology, this voltage level is approximately 1.8 volts to maintain logic circuits that have been source back-biased to reduce current therein. The voltage regulator 232 uses significant current for its own operation, thus limiting battery life.

Figure 3:
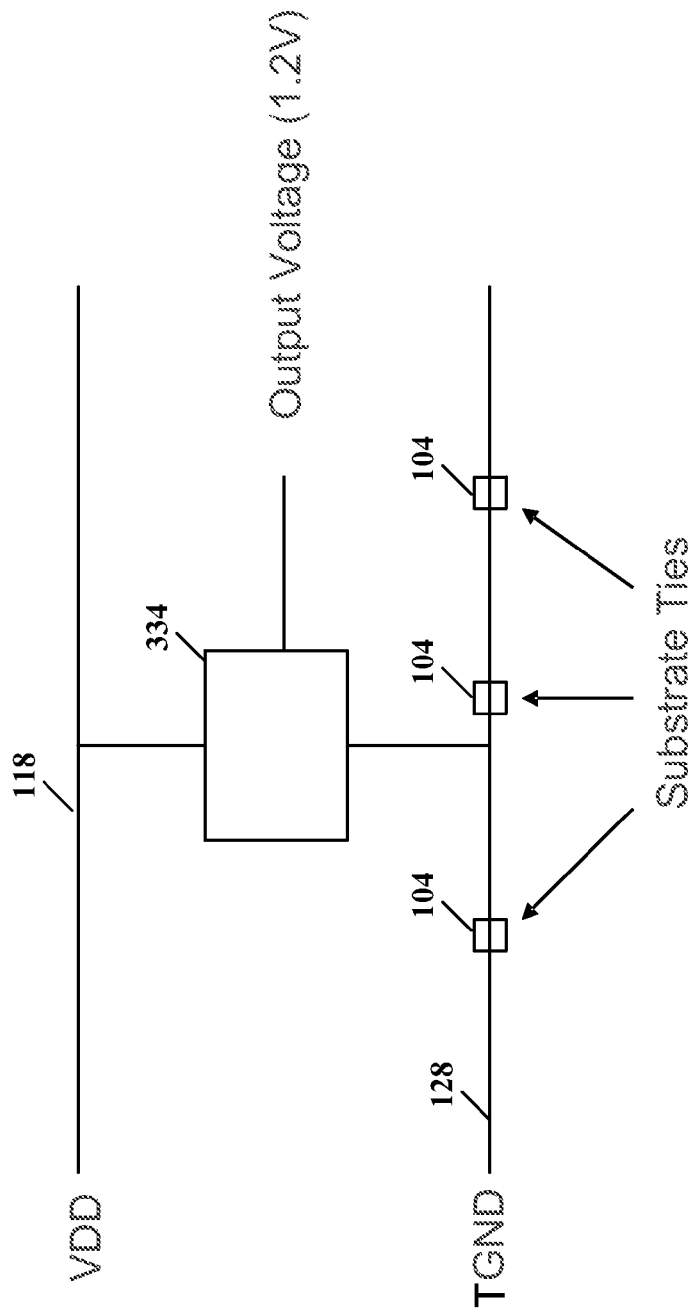
FIG. 3 illustrates a greatly simplified schematic diagram of a low voltage regulator.

Referring to FIG. 3, depicted is a greatly simplified schematic diagram of a low voltage regulator. A low voltage regulator 334 has a common rail connected to the same true ground, TGND, connection 128 that is also coupled to the p+ (substrate) ties 104. The low voltage regulator 334 has only an output voltage that is insufficient to maintain logic circuits that have been source back-biased to reduce current therein.

Figure 4:
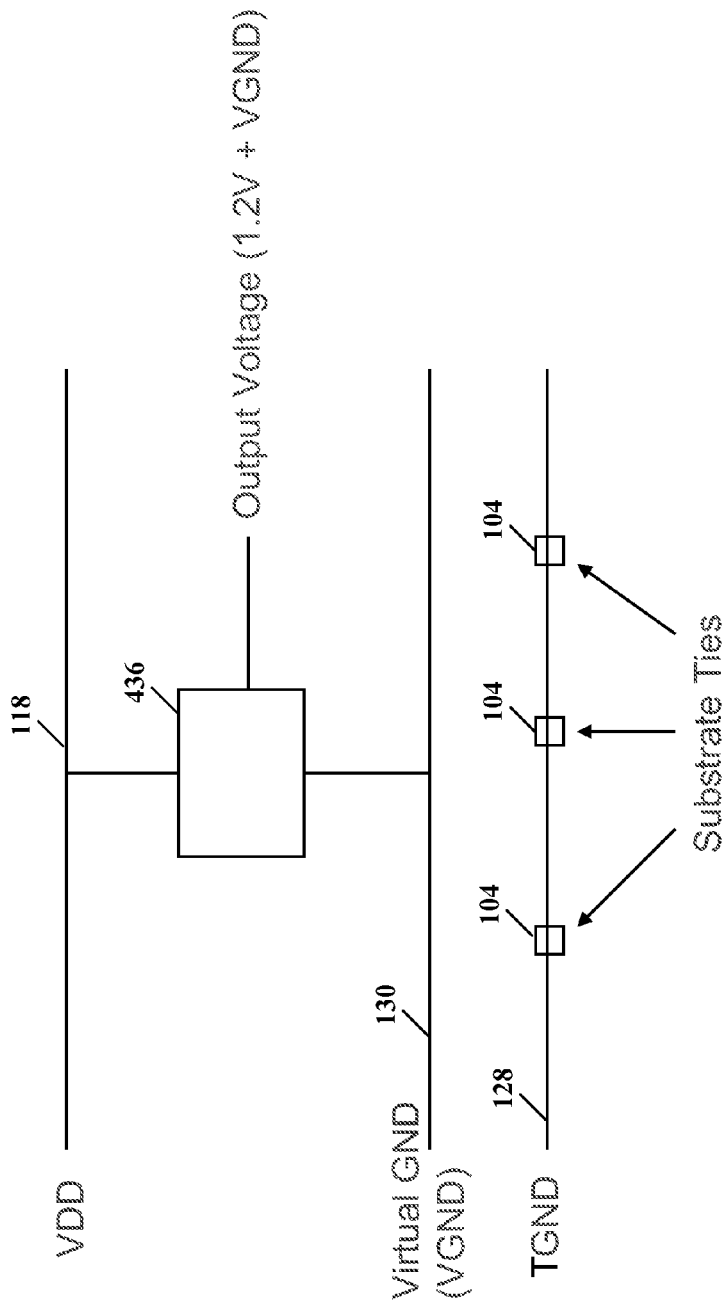
FIG. 4 illustrates a greatly simplified schematic diagram of a low voltage regulator, modified according to a specific example embodiment of this disclosure.

Referring to FIG. 4, depicted is a greatly simplified schematic diagram of a low voltage regulator, modified according to a specific example embodiment of this disclosure. The low voltage regulator 436 has a common rail connected to the virtual ground, VGND, connection 130 that is only coupled to the n+ source 106. The low voltage regulator 436 has an output voltage that is substantially the normal operating voltage for the logic minus the ground offset voltage, e.g., 1.2 volts for 180 nanometer process technology. Since the output voltage of the low voltage regulator 436 is referenced to the virtual ground, VGND, connection 130 and not the true ground, TGND, connection 128, it can maintain an output voltage providing substantially the normal operating voltage referenced to true ground, TGND, with reference to the n+ source 106, thereby maintaining logic circuits that have been source back-biased to reduce current therein.

Figure 5:
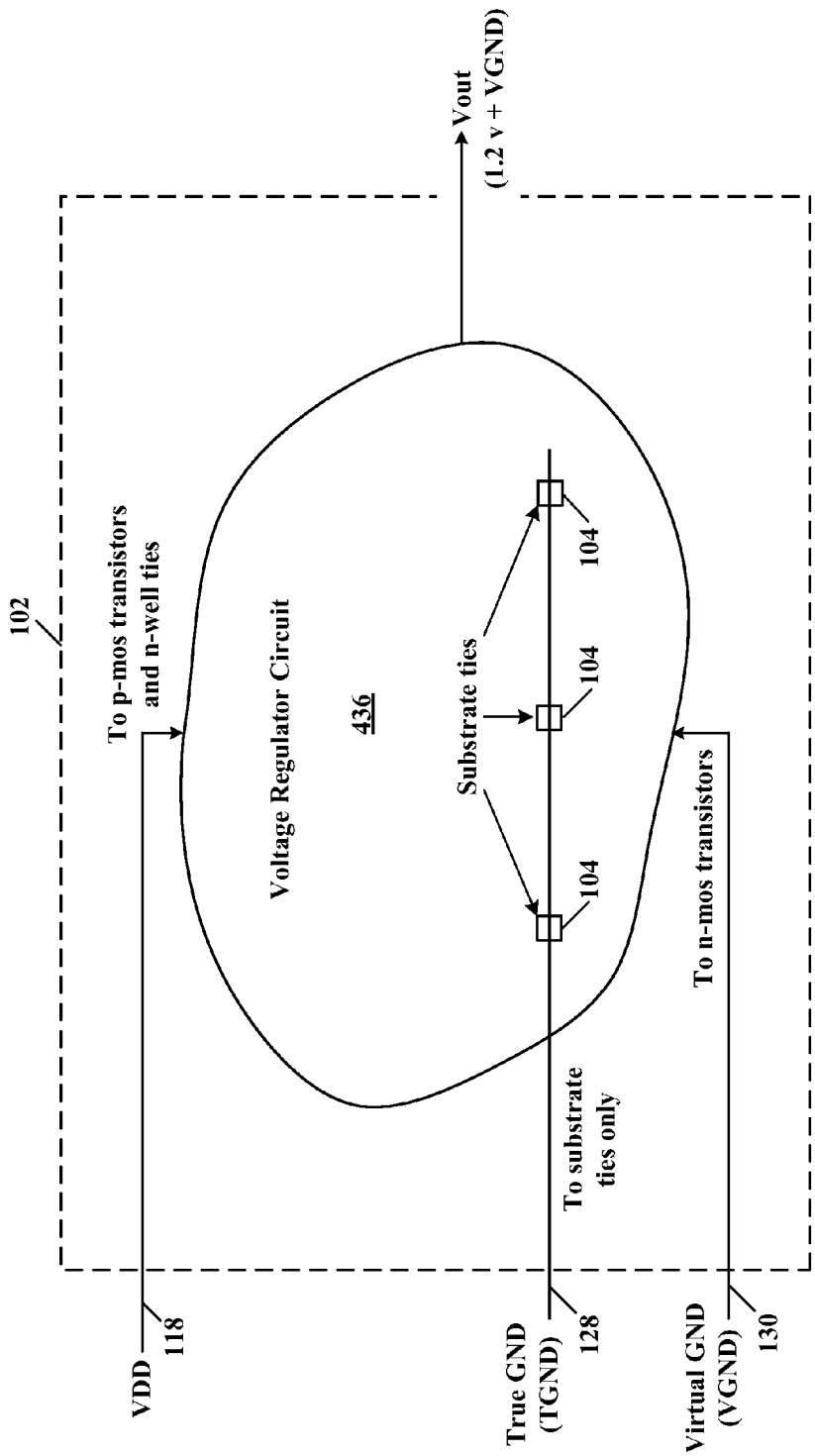
FIG. 5 illustrates a schematic diagram of a low voltage regulator for source-biased power domains, according to a specific example embodiment of this disclosure.

Referring to FIG. 5, depicted is a schematic diagram of a low voltage regulator for source-biased power domains, according to the teachings of this disclosure. There are two GND inputs to the voltage regulator, "true ground" called TGND and "virtual ground" called VGND. The TGND connection 128 is connected to only substrate ties to keep the substrate as close to zero (0) volts as possible. The VGND connection 130 is connected to various transistor drains, gates, or sources, as dictated by the voltage regulator design, the design of which is not covered herein. The output voltage VOUT is relative to VGND since the circuitry of the regulator 436 connects only to VGND and not TGND. Thus as VGND rises above zero (0) volts the output voltage, VOUT, will rise similarly.

Figure 6:
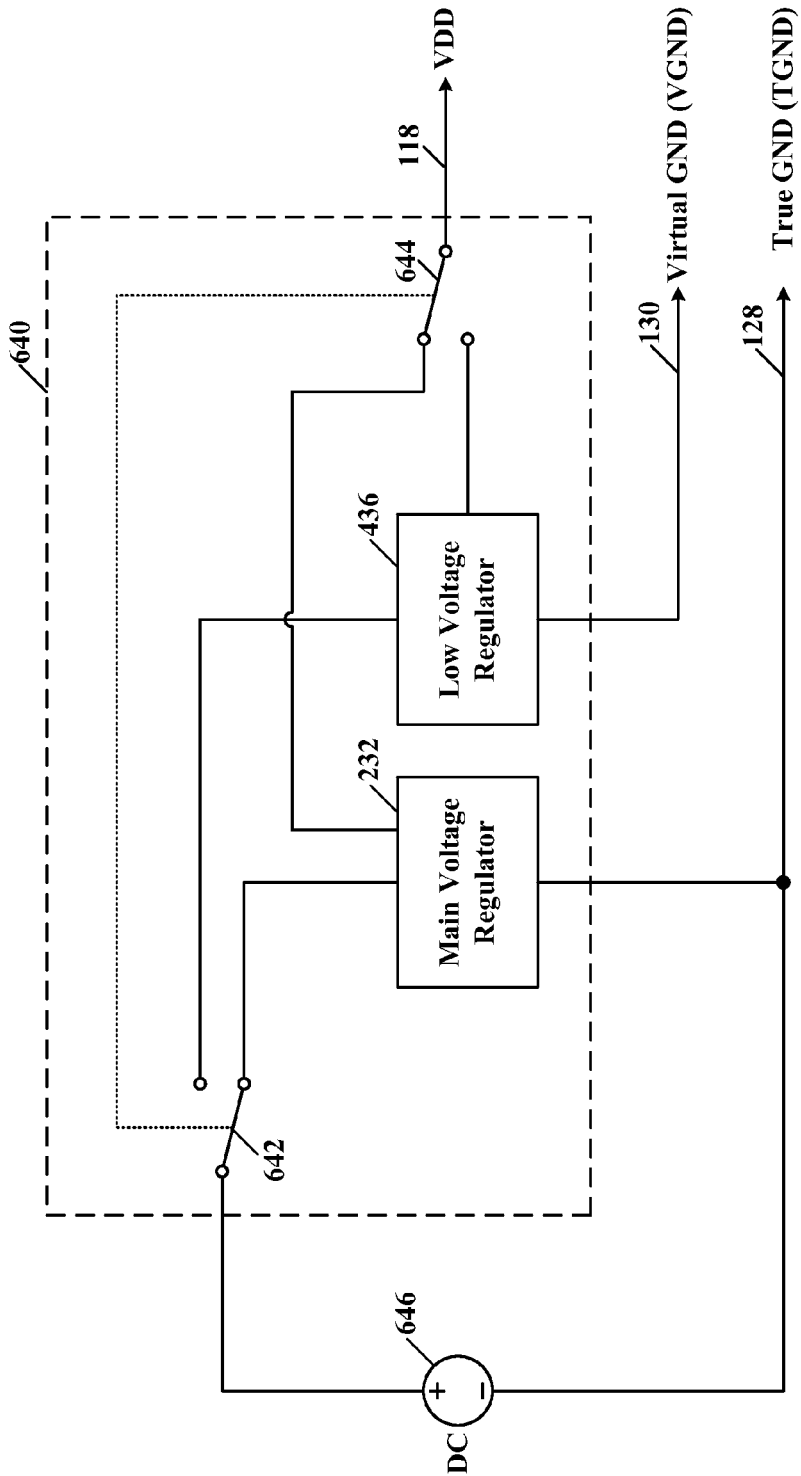
FIG. 6 illustrates a schematic block diagram of an integrated voltage regulator comprising switchable main and low voltage regulators, according to a specific example embodiment of this disclosure.

Referring to FIG. 6, depicted is a schematic block diagram of an integrated voltage regulator comprising switchable main and low voltage regulators, according to a specific example embodiment of this disclosure. An integrated voltage regulator 640 may comprise the main voltage regulator 232 and the low voltage regulator 436 previously described hereinabove, and voltage steering switches 642 and 644, e.g., field effect transistor (FET) switches. A direct current voltage (power) source 646, e.g., 3 volt supply, battery, etc., is coupled to the voltage steering switch 642 and supplies either the main voltage regulator 232 or the low voltage regulator 436 when in normal operation or low power back-biased standby, respectively. The other voltage steering switch 644 couples either the main voltage regulator 232 or the low voltage regulator 436 to VDD for the integrated circuit transistors when in normal operation or low power back-biased standby, respectively. It is contemplated and within the scope of this disclosure that the main voltage regulator 232, the low voltage regulator 436, and the voltage steering switches 642 and 644 may be separate or integrated into the integrated voltage regulator 640.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. An integrated circuit device comprising at least one power domain with a true ground connection and a virtual ground connection and a low voltage regulator, wherein the low voltage regulator having a ground connection coupled to the virtual ground of the at least one power domain, wherein the virtual ground is raised with respect to the true ground in a low power operation mode of the integrated circuit device, an input coupled to a supply voltage, and an output coupled to and supplying a regulated voltage to transistors in the at least one power domain; and
wherein the true ground is coupled to a substrate of the integrated circuit die, wherein when the virtual ground is raised relative to the true ground sufficient to reduce leakage current to an acceptable level in a given process technology, the output voltage of the low voltage regulator rises with the virtual ground voltage.

2. The integrated circuit device according to claim 1, wherein the regulated voltage from the low voltage regulator is approximately the normal operating voltage for logic minus an offset voltage at the virtual ground sufficient to reduce the leakage current to the acceptable level in the given process technology.

3. The integrated circuit device according to claim 2, wherein the regulated voltage from the low voltage regulator is approximately 1.2 volts for 180 nanometer process technology.

4. The integrated circuit device according to claim 1, wherein the virtual around is raised with a ground offset voltage relative to the true ground sufficient to reduce leakage current to an acceptable level in the given process technology.

5. The integrated circuit device according to claim 4, wherein the ground offset voltage is about 0.6 volts for 180 nanometer process technology.

6. The integrated circuit device according to claim 1, wherein the true ground is at substantially zero (0) volts.

7. The integrated circuit device according to claim 1, wherein a bias current of the low voltage regulator is about 100 nanoamperes.

8. The integrated circuit device according to claim 7, wherein the substrate is a p-substrate having holes as majority carriers.

9. The integrated circuit device according to claim 8, wherein the virtual ground is coupled to sources of n-mos transistors fabricated in the p-substrate.

10. The integrated circuit device according to claim 1, wherein the low voltage regulator is used to power the at least one power domain during said low power operation mode.

11. A method for powering an integrated circuit device with a low voltage regulator, said method comprising the steps of:
coupling a ground connection of the low voltage regulator to a virtual ground of at least one power domain in the integrated circuit device,
coupling an input of the low voltage regulator to a supply voltage, and supplying a regulated voltage to transistors in the at least one power domain;
coupling a true ground to a substrate of the integrated circuit device; and
raising the virtual ground relative to the true ground sufficient to reduce leakage current to an acceptable level in a given process technology, wherein the output voltage of the low voltage regulator rises with the virtual ground voltage.

12. The method according to claim 11, wherein the regulated voltage from the low voltage regulator is approximately the normal operating voltage for logic minus an offset voltage at the virtual ground sufficient to reduce the leakage current to the acceptable level in the given process technology.

13. The method according to claim 11, wherein during the step of raising the virtual ground voltage is performed by a ground offset voltage sufficient to reduce leakage current to an acceptable level in the given process technology.

14. The method according to claim 11, wherein the true ground is at substantially zero (0) volts.

15. The method according to claim 11, wherein a bias current of the low voltage regulator is about 100 nanoamperes.

16. The method according to claim 11, wherein the substrate is a p-substrate having holes as majority carriers.

17. The method according to claim 11, wherein the virtual ground comprises the step of coupling sources of n-mos transistors fabricated in the p-substrate to the virtual ground.

18. The method according to claim 11, further comprising the step of powering the at least one power domain with the low voltage regulator while said virtual ground is raised.

19. The integrated circuit device according to claim 1, further comprising a main voltage regulator having an input operable to be coupled with a power supply voltage, an output providing a regulated voltage and a ground connection coupled with the true ground, and a switching unit operable to either connect the input of the main voltage regulator or the input of the low voltage regulator with said power supply voltage and either connect the output of the main voltage regulator or the output of the low voltage regulator, respectively with an internal power supply connection of the integrated circuit device.

20. An integrated circuit device comprising a linear low voltage regulator, wherein:
the linear low voltage regulator having a ground connection coupled to a virtual ground of at least one power domain in the integrated circuit die that is capable of being back-biased, an input coupled to a supply voltage, and an output coupled to and supplying a regulated voltage to transistors in the at least one power domain; and
a true ground is coupled to a substrate of the integrated circuit die, wherein when the virtual ground through back-biasing is raised relative to the true ground sufficient to reduce leakage current to an acceptable level in a given process technology, the output voltage of the linear low voltage regulator rises with the virtual ground voltage.

* * * * *

UNITED STATES PATENT AND TRADEMARK OFFICE
CERTIFICATE OF CORRECTION

| | | |
|---|---|---|
| PATENT NO. | : 8,970,190 B2 | Page 1 of 1 |
| APPLICATION NO. | : 13/409440 | |
| DATED | : March 3, 2015 | |
| INVENTOR(S) | : Muha et al. | |

It is certified that error appears in the above-identified patent and that said Letters Patent is hereby corrected as shown below:

In the Claims

Column 6,
Claim 4, line 23, "…wherein the virtual around is raised with a ground offset…" ---Change to---
"…wherein the virtual ground is raised with a ground offset…"

Signed and Sealed this
Twenty-third Day of June, 2015

Michelle K. Lee
*Director of the United States Patent and Trademark Office*